(12) United States Patent
Böhnke

(10) Patent No.: US 6,557,139 B2
(45) Date of Patent: Apr. 29, 2003

(54) ENCODING APPARATUS AND ENCODING METHOD FOR MULTIDIMENSIONALLY CODING AND ENCODING METHOD AND DECODING APPARATUS FOR ITERATIVE DECODING OF MULTIDIMENSIONALLY CODED INFORMATION

(75) Inventor: Ralf Böhnke, Esslingen (DE)

(73) Assignee: Sony International (Europe) GmbH, Berlin (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/456,376

(22) Filed: Dec. 8, 1999

(65) Prior Publication Data

US 2003/0033571 A1 Feb. 13, 2003

(30) Foreign Application Priority Data

Dec. 10, 1998  (EP) .............................................. 98123611

(51) Int. Cl.[7] .............................................. H03M 13/00
(52) U.S. Cl. ........................ 714/758; 714/755; 714/761
(58) Field of Search ................................ 714/755, 758, 714/786, 794, 701, 756, 761

(56) References Cited

U.S. PATENT DOCUMENTS

| | | | | |
|---|---|---|---|---|
| 5,812,603 A | * | 9/1998 | Luthi et al. ................. | 375/287 |
| 6,105,158 A | * | 8/2000 | Chen et al. ................. | 714/755 |
| 6,233,709 B1 | * | 5/2001 | Zhang et al. ............... | 714/774 |
| 6,292,918 B1 | * | 9/2001 | Sindhushayana et al. ... | 714/755 |

OTHER PUBLICATIONS

Narayanan et al., IEEE Communications Letters vol. 1 No. 5, Sep. 1997.*
Narayanan, K.R., et al.: "Selective Serial Concatenation of Turbo Codes" IEEE Communications Letters, vol. 1 No. 5, Sep. 1, 1997, pp. 136–139, XP000704755.
Bauch, G., et al.: "Iterative Equalization and Decoding in Mobile Communications Systems", Proceedings of European Personal and Mobile Communications Conference, Sep. 30, 1997, pp. 307–312, XP002060630.

* cited by examiner

Primary Examiner—Albert Decady
Assistant Examiner—Matthew C. Dooley
(74) Attorney, Agent, or Firm—Frommer Lawrence & Haug LLP; William S. Frommer

(57) ABSTRACT

The present invention provides an encoding apparatus, comprising means (21) for generating a checksum for incoming data, means (22) for constructing frames on the basis of said incoming data and said generated checksum, and means (23) for multidimensionally coding said frames. Further, the present invention comprises a decoding apparatus for iterative decoding of multidimensionally decoded information, comprising means (28) for performing at least one decoding iteration on multidimensionally coded information, and means (32) for checking the decoded information after each decoding iteration and for causing said decoding iteration means (28) to perform a further decoding iteration on the basis of a checking result. The present invention further comprises the corresponding encoding method and decoding method. The average processing delay and the computational complexity is significantly reduced, since only the required number of iteration steps is adaptively performed in the decoding apparatus.

12 Claims, 4 Drawing Sheets

ENCODING APPARATUS AND ENCODING METHOD FOR MULTIDIMENSIONALLY CODING AND ENCODING METHOD AND DECODING APPARATUS FOR ITERATIVE DECODING OF MULTIDIMENSIONALLY CODED INFORMATION

BACKGROUND OF THE INVENTION

The present invention relates to an encoding method and an encoding apparatus for multidimensionally coding information to be transmitted in a communication system. The present invention further relates to a decoding method and a decoding apparatus for iterative decoding of multidimensionally coded information. The encoding method, the encoding apparatus, the decoding method and the decoding apparatus of the present invention may be implemented in a communication unit of a communication system, e. g. a wireless telecommunication system.

During the transmission of information from a transmission unit to a receiving unit, e. g. from a base station to a mobile station of a wireless telecommunication system, errors may occur in disturbed transmission channels. These errors have to be detected and eventually corrected in the receiving unit. Channel coding is used to provide a possibility for the detection and correction of errors in the transmitted information. The channel code usually comprises additional error code symbols or error code bits, which are added to the information to be transmitted. These redundant error bits are transmitted with the information and are decoded on the receiving side, so that errors in the transmitted information can be detected and eventually corrected.

In order to provide a channel code, an encoding apparatus comprised in the transmission unit derives error code bits from the information bits by means of a corresponding coding method. On the receiving side, the error code bits enable to detect disturbed information bits. Depending on the size and the location of the error and the amount of error code bits it is eventually possible to correct the errors.

For such a channel coding, multiple encoding methods may be used. One of these encoding methods is the multidimensional coding. One of the multidimensional coding types are parallel concatenated systematic recursive codes, so-called turbo-codes, which are e. g. described in C. Berrou "Near Shannon limit error-correcting and decoding:

Turbo-Codes (1)", Proc. ICC'93, May 1993.

Multidimensional codes are decoded on the receiving side by means of an iterative decoding processing. Thereby, a fixed number of iterations or iteration steps are performed to achieve a certain bit error rate or frame error rate. A fixed number of iterations or decoding loops, e. g. 8 or 16, is performed in the turbo decoding process to ensure a sufficient overall performance.

In FIG. 1, a known encoding structure of an encoding apparatus with a code rate of ⅓ is shown. The input information is an encoded block of N bits, which are encoded in the encoding apparatus and output on three output lines. The known encoding apparatus shown in FIG. 1 generally consists of a first constituent encoder 1 and a second constituent encoder 2. The first constituent encoder 1 is provided with unchanged input information, whereas the second constituent encoder 2 is provided with input information processed in a turbo interleaving means 3.

The first constituent encoder 1 comprises a first delay means 4 and a second delay means 5. Both delay means 4 and 5 delay the respective input information by one bit. The unchanged input information supplied to the first constituent encoder 1 is input to the first delay means 4, delayed by one bit and then supplied to the second delay means 5 and there delayed by a further bit. The output signal from the second delay means 5 is fed back and added to the unchanged input information and the output signal of the first delay means 4 in an adding means 6. The output signal from the adding means 6 is supplied to the delay means 4 as well as to an adding means 7. In the adding means 7, the output signal from the adding means 6 is added to the output signal of the second delay means 5. The output signal of the adding means 7 is the second output (output 1) of the shown turbo encoding apparatus.

The input information of the encoding apparatus shown in FIG. 1 is further supplied to a turbo interleaving means 3, where the information bits are interleaved and then supplied to a second constituent encoder 2. The input information of the second constituent encoder 2 is supplied to a first delay means 8, delayed by one bit, supplied to a second delay means 9 and delayed by a second bit there. The output signal from the second delay means 9 is fed back to an adding means 10, in which the output signal from the first delay means 8, and the output signal from the turbo interleaving means 3 and the output signal from the second delay means 9 are added. The output signal from the adding means 10 is the input of the first delay means 8. The output signal of the second delay means 9 is further fed to an adding means 11, in which it is added to the output signal of the adding means 10 to provide the third output signal (output 2) of the shown encoding apparatus.

The first output signal (output 0) of the encoding apparatus shown in FIG. 1 is the unchanged input information.

The three output signals of the encoding apparatus shown in FIG. 1 are then further processed and transmitted in a transmission channel to a receiving apparatus, in which they are turbo decoded, e. g. by a turbo decoding apparatus 12 as shown in FIG. 2. The known turbo decoding apparatus 12 shown in FIG. 2 is supplied with three input signals corresponding to the three output signals of the known encoding apparatus shown in FIG. 1. The received information bits, which correspond to the first output signal of the encoding apparatus of FIG. 1 are the unchanged information bits, which are fed to a first constituent decoder 13 of the turbo decoding apparatus 12. The received parity bits of the first code are soft parity information, which are also supplied to the first constituent decoder 13, correspond to the second output (output 1) of the encoding apparatus of FIG. 1. The received parity bits of the second code are soft parity information, which are fed to the second constituent decoder 14 of the turbo decoding apparatus 12 correspond to the third output (output 2) of the encoding apparatus shown in FIG. 1. The second output (output 1) and the third output (output 2) of the encoding apparatus of FIG. 1 are therefore error code bits (parity bits), which are transmitted together with the unchanged information bits to provide an error code, which is used on the receiving side to detect and eventually correct errors in the transmitted information signal (output 0).

The received parity bits of the first code and the received information bits are supplied to the first constituent decoder 13 of the turbo decoding apparatus 12 and processed to provide decoded soft decision values, which are supplied to and processed in a deinterleaver 15. The deinterleaved soft decision values from the deinterleaver 15 are supplied to the second constituent decoder 14 of the turbo decoder apparatus 12. The received information bits are further supplied to an interleaver 16. The interleaved information bits from the interleaver 16 are also supplied to the second constituent decoder 14. The received parity bits of the second code are supplied to the second constituent decoder 14. In the second constituent decoder 14, the three input signals are decoding processed. The output signal from the second constituental decoder 14 comprises soft decision values, which are fed back to an deinterleaver 18. The deinterleaved soft decision values from the deinterleaver 18 are fed back and supplied to the first constituent decoder 13.

In the known turbo decoding apparatus 12 shown in FIG. 2, the number of iterations through the deinterleaver 18 is a fixed number of iterations, e. g. 8 or 16 to provide a sufficient overall performance in terms of the bit error rate or frame error rate. Thereby, in each iteration step, the second constituent decoder improves the soft decision likelihood values of the first constituent decoder 13 and the deinterleaver 15. In each iteration step, the soft decision likelihood values are therefore changed and improved to improve the performance in term of the bit error rate and the frame error rate. After a predetermined fixed number of iteration steps, the soft decision likelihood values output from the second constituent decoder 14 are supplied to a deinterleaver 17. The deinterleaved soft decision likelihood values from the deinterleaver 17 are supplied to a hard decision means 19, in which the soft decision likelihood values are transformed into hard decision values, e. g. bits of the values "0" or "1" to provide an output signal. Since always the same high number of iteration steps is performed, the computational load and thus the power consumption and also the processing delay, since each iteration loop needs a certain processing time, are very high.

One proposal to determine an adaptive stop criteria in iterative decoding of multidimensionally decoded information is described in EP 0 755 122 A2. In this proposed structure, a comparison of the soft decision values output from the second constituent decoder after each iteration step with the soft decision values of the immediately preceding iteration step is performed. If the soft decision values between two immediately succeeding iteration steps do not change, the decoding iteration is stopped. However, if the transmitted information bits are erroneous, this proposed method does not provide a possibility to detect and correct errors. Further, always one iteration step more than needed is performed, since the proposed stop criteria requires that two succeeding iteration steps result in the same soft decision likelihood values.

SUMMARY OF THE INVENTION

The object of the present invention is therefore to provide an encoding apparatus, an encoding method, a decoding apparatus and a decoding method, which enable an optimized and effective iterative decoding of multidimensionally coded information.

This object is achieved by a decoding apparatus according to claim 1, a decoding method according to claim 8, an encoding apparatus according to claim 9 and an encoding method according to claim 11.

The decoding apparatus for iterative decoding of multidimensionally encoded information according to the present invention comprises means for performing at least one decoding iteration on multidimensionally coded information, and means for checking the decoded information after each decoding iteration and for causing said decoding iteration means to perform a further decoding iteration on the basis of a checking result. The decoding method for iterative decoding of multidimensionally coded information according to the present invention comprises the steps of performing at least one decoding iteration on multidimensionally coded information, and checking the decoded information after each decoding iteration step and for causing a further decoding iteration to be performed on the basis of a checking result.

The encoding apparatus according to the present invention comprises means for generating a checksum for incoming data, means for constructing frames on the basis of said incoming data and said generated checksum, and means for multidimensionally coding said frames.

The encoding method according to the present invention comprises the steps of generating a checksum for incoming data, constructing frames on the basis of said incoming data and said generated checksum, and multidimensionally coding said frames.

The present invention therefore provides an encoding apparatus and method and a decoding apparatus and means, which enable an optimized and effective iterative decoding of multidimensionally coded information. Particularly, no more decoding iteration steps are performed if the information has been decoded correctly. Thereby, the mean number of iteration steps is reduced without sacrificing the performance of the turbo decoding. The reduction of the iteration steps ensures less computational complexity and less processing delay, whereby at the same time the decoding performance is maintained. Since the maximum numbers of iteration steps in the decoding processing can still be fixed, the overall performance in terms of the bit error rate and the frame error rate is the same as in the state of the art, however, the mean number of iteration steps is reduced dramatically. This is particularly due to the fact that many transmitted data frames can be decoded and corrected completely with a much less number of iteration steps compared to the maximum possible number of iteration steps.

Advantageously, the checking means of the decoding apparatus according to the present invention comprises an error detection means for detecting an error in said decoded information. In this case, the multidimensionally coded information may comprise a cyclic redundancy checksum, whereby said error detection means performs a cyclic redundancy check on said decoded information. Thereby, a small cyclic redundancy checksum might be appended to each information frame.

Alternatively, the checking means of the decoding apparatus according to the present invention may comprise an error detection and correction means for performing an error detection and correction on said decoded information. This construction is very effective in correcting bit errors in the transmitted information even if the decoding iteration means was not able to correct all errors even after the maximum number of decoding iteration steps.

Further advantageously, the checking means provide a control signal for causing said decoding iteration means to perform another iteration if the checking result is negative. Thus, the decoding iteration means only performs one iteration at a time and is controlled or triggered by a control signal from the checking means to continue the decoding processing in case that the checking result indicates, that the decoded information are not yet correct.

The means for performing at least one decoding iteration on multidimensionally coded information in the decoding apparatus of the present invention is preferably a decoding means known in the state of the art, so that the decoding apparatus according to the present invention can be built in a simple and effective way using a known decoding iteration means.

Further advantageously, the decoding apparatus according to the present invention comprises a counting means for counting the number of decoding iteration steps performed by said decoding iteration means and for causing decoded information to be output if a predetermined maximum number of iteration steps is reached even if said checking result is negative. In other words, the maximum number of decoding iteration steps is limited to a predetermined maximum number. The checking result of the decoded information, which usually are soft decision likelihood values, can still be used in a further stage of the processing, since a reliability value of the decoded information is provided by the checking result, even if the checking result is negative. On the basis of this reliability information, one of the next stages of the processing of the information can decide how to deal with the corresponding information data frame still containing errors.

Further advantageously, the decoding apparatus according to the present invention comprises means for extracting data from said decoded information if said checking result is positive and for outputting said extracted data. If, e. g. the decoded information contain a checksum appended to the transmission data, the checksum data are removed and the information data of interest are extracted to be further processed.

In the encoding apparatus of the present invention, the checksum generating means advantageously generates a checksum for a cyclic redundancy check. New data frames are then constructed using the original incoming data bits and the generated cyclic redundancy check bits. Although this creates some overhead, this overhead is very small and is used on the receiving side to significantly reduce the power consumption and the computational complexity.

BRIEF DESCRIPTION OF THE DRAWINGS

Preferred embodiments of the present invention are described in the following description in relation to the enclosed drawings, in which.

DETAILED DESCRIPTION OF THE INVENTION

Figure 3:
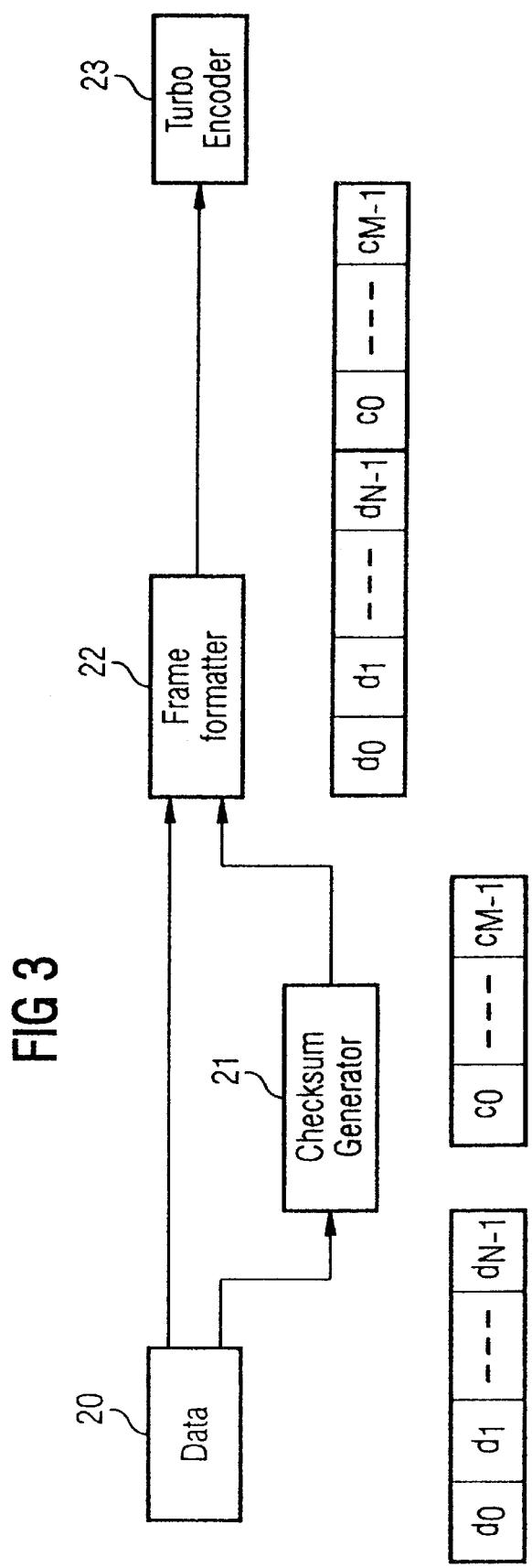
FIG. 3 shows an encoding structure according to the present invention.

In FIG. 3, a block diagram of an encoding structure according to the present invention is shown, which comprises a data input means 20, a checksum generator 21, a frame formatter 22 and a turbo encoder 23. The data input means 20 receives serially arranged data bits, e. g. in data frames consisting of N data bits, $d_0, d_1, \ldots, d_{N-1}$. The data frames output from the data input means 20 are supplied to the checksum generator 21, which generates a checksum, e. g. a cyclic redundancy checksum, on the basis of the input frame bits. If the input data frames comprise e. g. 1024 bits, the cyclic redundancy checksum generated in the checksum generator 21 might comprise 16 checksum bits $c_0, \ldots, c_{M-1}$, whereby M=16 in this case.

Figure 1:
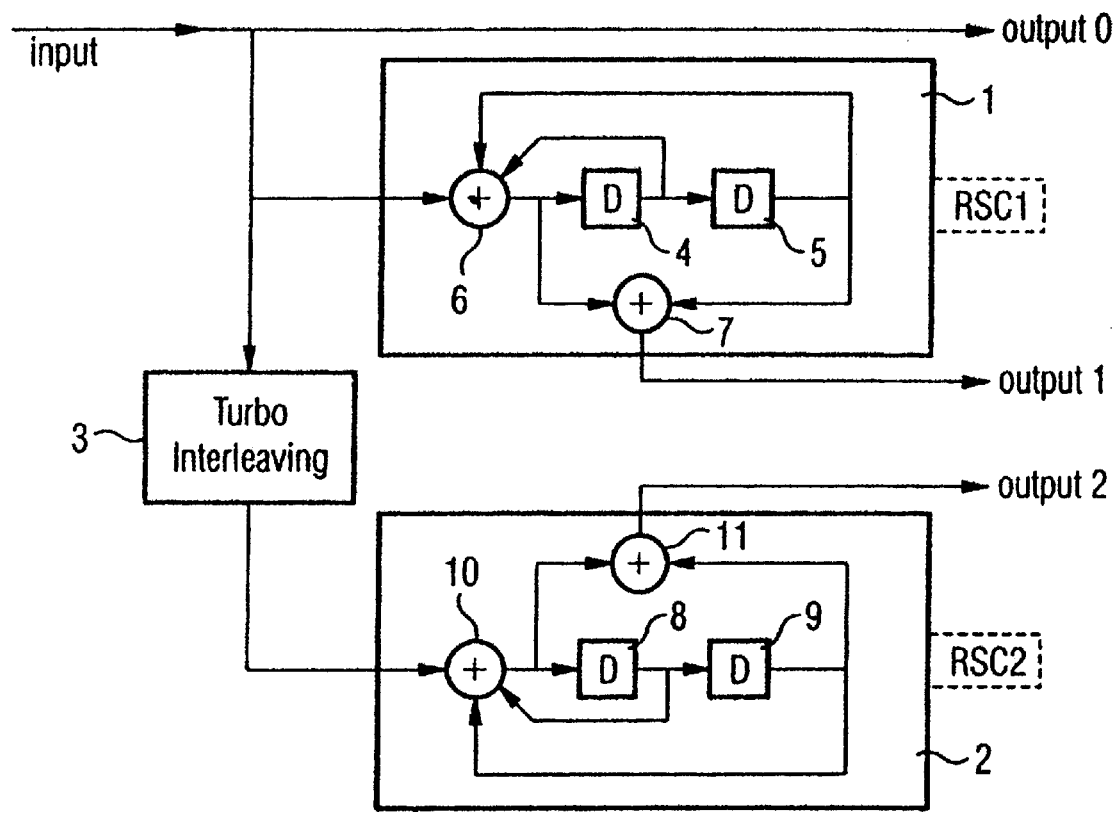
FIG. 1 shows an encoding structure of the prior art.

The frame formatter 22 receives the data frames from the data input means 20 and the checksum bits generated in the checksum generator 21 and constructs a new frame consisting of the original information data bits and the generated checksum bits. In the above-mentioned example, a new frame might therefore consist of 1024+16=1040 bits. The thus created overhead compared to the original frame size is 16/1040=1.5%, thus very small. The output of the frame formatter 22 which is information arranged in the new frames is then supplied to the turbo encoder 23. The turbo encoder 23 is only one exemplary type of a coding means for multidimensional encoding of information to be transmitted. In the described embodiment, a turbo encoder 23 has exactly the same construction as the encoding structure shown in FIG. 1, so that a description is omitted.

Figure 4:
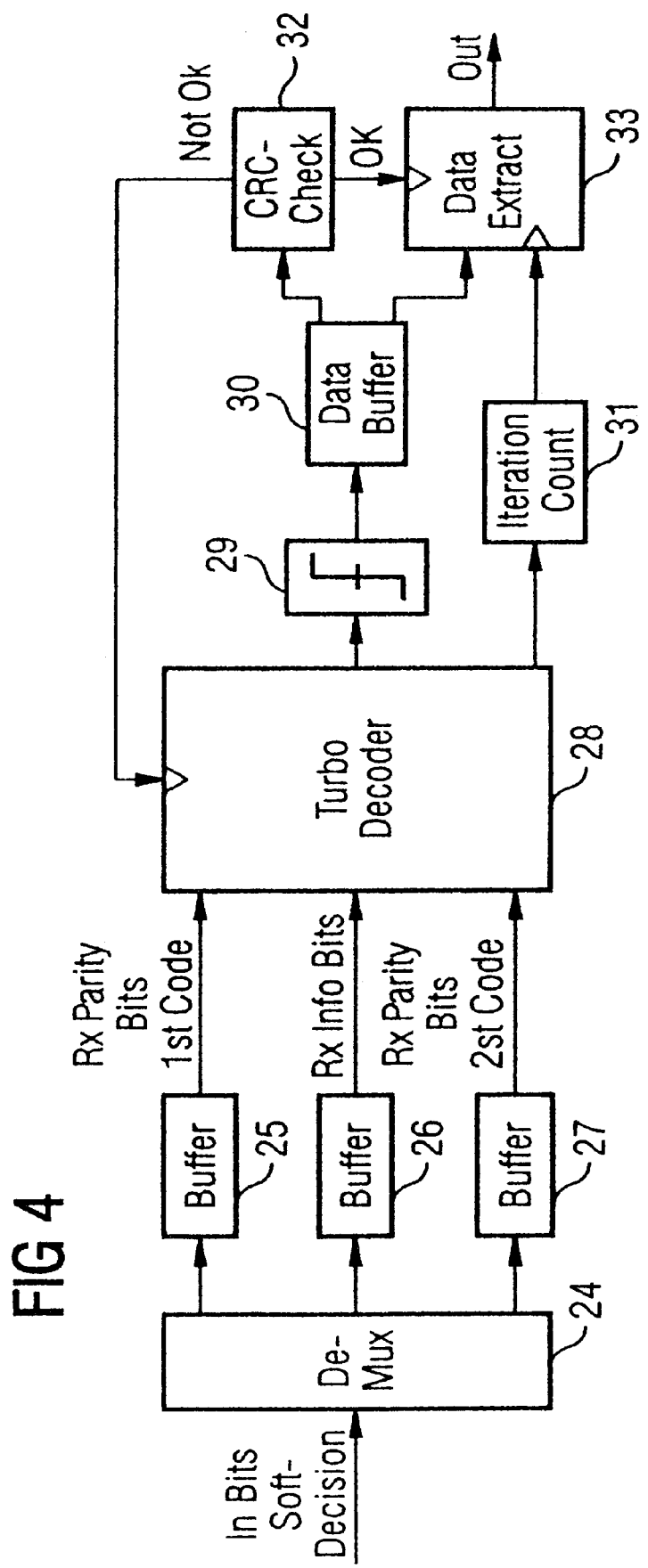
FIG. 4 shows a decoding structure of the present invention.

In FIG. 4, an embodiment of a decoding structure according to the present invention is shown. Incoming information bits in form of soft decision values, e. g. coming from a demodulator, are demultiplexed in a demultiplexer 24 into three different output signals to separate the soft data bits and the soft parity information. The three different output signals correspond to the three output signals generated in the turbo encoder of the corresponding transmitting unit, e. g. the encoding structure shown and described in FIG. 1. The first output signal is the unchanged received information bits, which are intermediately stored in a buffer 26. The second output signal from the demultiplexer 24 is the received parity bits of the first code, which are intermediately stored in a buffer 25. The third output signal from a demultiplexer 24 are the received parity bits of the second code, which are intermediately stored in a buffer 27. The three output signals from the buffers 25, 26 and 27 are supplied to a decoding means for iterative decoding of multidimensionally coded information, e. g. a turbo decoder 28.

Figure 2:
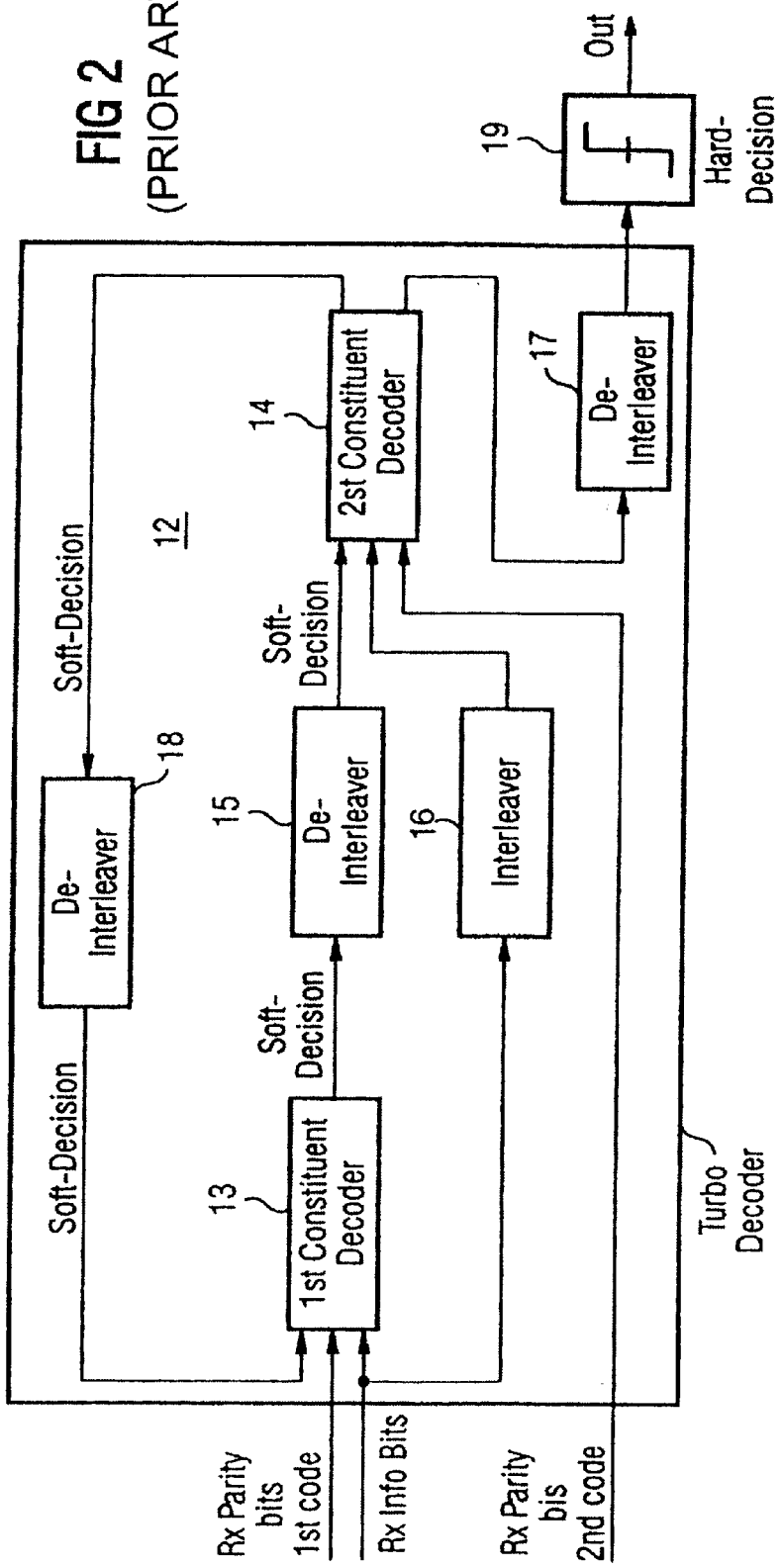
FIG. 2 shows a turbo decoding structure of the prior art.

The turbo decoder 28 of the present invention comprises the same elements as the turbo decoder 12 shown and described in FIG. 2, so that a description is omitted. However, the turbo decoder 28 only performs one decoding iteration step at a time and is triggered by a corresponding control signal for every iteration step to be performed, except the first iteration step for each incoming frame to be decoded.

Besides the means for performing at least one decoding iteration on multidimensionally coded information, e. g. the shown turbo decoder 28, the decoding apparatus according to the present invention further comprises means 32 for checking the decoded information after each decoding iteration and for causing said decoding iteration means, e. g. said turbo decoder 28, to perform a further decoding iteration on the basis of a checking result. The means for checking the decoded information is a cyclic redundancy checksum checking means 32 in the example shown in FIG. 4, which detects errors in the transmitted data $d_0, d_1, \ldots, d_{N-1}$ on the basis of the appended checksum bits $C_0, \ldots, C_{M-1}$ of each frame. In front of the checking means 32, however, a hard decision means 29, which corresponds to the hard decision means 19 shown in FIG. 2, and the data buffer 30 are arranged. The hard decision means 29 transforms the soft decision values output from the turbo decoder 28 into hard decision values, e. g. bits ("0" or "1") and delivers these hard decision values to the data buffer 30, in which they are intermediately stored. The stored information of the data buffer 30 is then supplied to the checking means 32 frame by frame. The checking means 32 performs a cyclic redundancy check to detect errors in the transmitted data. If an error is detected in the transmitted data $d_0, d_1, \ldots, d_{N-1}$, a control signal is generated and fed back to the turbo decoder 28. The turbo decoder 28 comprises a trigger unit or a control unit to activate the turbo decoder 28 to perform a further decoding iteration step each time a control signal from the checking means 32 is received. After each iteration step in the turbo decoder 28, the soft decision values output from the turbo decoder 28 go through the hard decision unit 29 to be stored in the data buffer 30. The buffer 30 thereby contains estimates of the original transmitted information data and cyclic redundancy check bits.

Further, a signal indicating the termination of each iteration loop output from the turbo decoder 28 is supplied to an iteration counter 31 to count the iteration steps. The iteration counter 31 is increased after each turbo decoder iteration step and reset to zero, when a new frame is received and the former frame of data is output because either the checking result in the checking means 32 is positive or the maximum number of iteration steps in the turbo decoder 28 has been performed. If the iteration counter indicates, that the maximum number of iterations steps has been performed, e. g. 8 or 16, the iteration counter 31 provides a corresponding control signal or trigger signal to the data extracting means 33. The data extracting means 33 extracts then the data from the checked data frames, whereby the appended cyclic redundancy check bits are removed, and delivers the extracted data to an output terminal. The additional signalling of the cyclic redundancy check status given by the checking result can be used in the next processing stages to decide how to deal with the erroneous data frame.

Another embodiment of the present invention, an error correction code instead of the error detection cyclic redundancy check code can be used. In this case, an error correction code, e. g. a BCH codec to detect and correct bit errors or an RS (Reed-Solomon) codec to detect and correct symbol errors might be generated and added to the data to be transmitted in the encoding apparatus of the present invention. In the decoding apparatus of the present invention, instead of the cyclic redundancy checksum checking means 32, a corresponding error detection and correction means for the respective code can be used. Thereby it becomes possible, to correct bit errors even if the turbo decoder was not able to correct all errors after the maximum number of iteration steps.

The present invention therefore provides a decoding apparatus and a decoding method for iterative decoding of multidimensionally coded information with a significantly reduced complexity. Further, the average processing delay is reduced, since the number of required iteration steps is very small compared to the maximum number of iteration steps. The decoding apparatus and the encoding apparatus provide a simple and cheap structure, whereby only a small overhead, namely the cyclic redundancy checksum, is required. The computational complexity is reduced adaptively to the required number of iteration steps in the turbo decoder 28 of the decoding apparatus. The detection of a correct frame is very robust and reliable compared to other schemes which observe the exchanged extrinsic information directly, and no unnecessary iteration steps are performed in the decoding apparatus of the present invention. Further, always the exactly required number of necessary iteration steps is performed.

What is claimed is:

1. Decoding apparatus for iterative decoding of multidimensionally coded information, comprising:
    means for performing at least one decoding iteration on multidimensionally coded information;
    means for checking the decoded information after each decoding iteration for errors;
    error detection and correction means for performing error detection and correction on said decoded information; and
    means for causing the decoding iteration means to perform a further decoding iteration if (i) a checking result from the checking means indicates that an error exists in the decoded information and (ii) the number of iterations is less than a predetermined number and for causing the error correction means to perform error correction on the decoded information if (i) a checking result from the checking means indicates that an error exists in said decoded information and (ii) the number of iterations is equal to the predetermined number.

2. Decoding apparatus for iterative decoding of multidimensionally coded information according to claim 1, characterized in, that said multidimensionally coded information comprise a cyclic redundancy checksum and said error detection and correction means perform a cyclic redundancy check on said decoded information.

3. Decoding apparatus for iterative decoding of multidimensionally coded information according to claim 1, further comprising counting means for counting the number of decoding iterations performed by said decoding iteration means and for causing decoded information to be output if a predetermined number of iterations is reached even if said checking result indicates that an error exists in said decoded information.

4. Decoding apparatus for iterative decoding of multidimensionally coded information according to claim 1, further comprising means for extracting data from said decoded information if said checking result indicates that no error exists in said decoded information and the number of iterations is equal to the predetermined number, and for outputting said extracted data.

5. Decoding method for iterative decoding of multidimensionally coded information, comprising the steps of:
    performing at least one decoding iteration on multidimensionally coded information;
    checking the decoded information after each decoding iteration for errors;
    performing error detection and correction on said decoded information; and
    causing a further decoding iteration if (i) a checking result indicates that an error exists in the decoded information and (ii) the number of iterations is less than a predetermined number and for causing error correction to be performed on the decoded information if (i) a checking result indicates that an error exists in said decoded information and (ii) the number of iterations is equal to the predetermined number.

6. Decoded method for iterative decoding of multidimensionally coded information according to claim 5, characterized in, that said error detection and correction step a cyclic redundancy check on said decoded information is performed.

7. Decoding method for iterative decoding of multidimensionally coded information according to claim 5, further comprising a step of counting the number of decoding iterations performed, whereby decoded information is output if a predetermined number of iterations is reached even if said checking result indicates that an error exists in said decoded information.

8. Decoding method for iterative decoding of multidimensionally coded information according to claim 5, further comprising a step of extracting data from said decoded information if said checking result indicates that no error exists in said decoded information and the number of iterations is equal to the predetermined number, and outputting said extracted data.

9. Encoding apparatus, comprising means for generating a checksum for incoming data, means for constructing frames on the basis of said incoming data and said generated checksum, and means for multidimensionally coding said frames, whereby, during a decoding operation, said checksum is used for error detection, and a ratio of checksum bits to incoming data bits is approximately 1.5% or less.

10. Encoding apparatus according to claim 9, characterized in, that said checksum generating means (21) generates a checksum for a cyclic redundancy check.

11. Encoding method comprising the steps of generating a checksum for incoming data, constructing frames on the basis of said incoming data and said generated checksum, and multidimensionally coding said frames, whereby, during a decoding operation, said checksum is used for error detection, and a ratio of checksum bits to incoming data bits is approximately 1.5% or less.

12. Encoding method according to claim 11, characterized in, that in said checksum generating step a checksum for a cyclic redundancy check is generated.

\* \* \* \* \*